US009936598B2

(12) United States Patent
Gruber

(10) Patent No.: US 9,936,598 B2
(45) Date of Patent: Apr. 3, 2018

(54) MODULAR DEVICE FOR OPEN-LOOP CONTROL OR CLOSED-LOOP CONTROL OF A TECHNICAL INSTALLATION

(71) Applicant: Pilz GmbH & Co. KG, Ostfildern (DE)

(72) Inventor: Winfried Gruber, Ostfildern (DE)

(73) Assignee: PILZ GMBH & CO. KG, Ostfildern (DE)

( * ) Notice: Subject to any disclaimer, the term of this patent is extended or adjusted under 35 U.S.C. 154(b) by 99 days.

(21) Appl. No.: 14/707,413

(22) Filed: May 8, 2015

(65) Prior Publication Data

US 2015/0245526 A1    Aug. 27, 2015

Related U.S. Application Data

(63) Continuation of application No. PCT/EP2013/071922, filed on Oct. 21, 2013.

(30) Foreign Application Priority Data

Nov. 8, 2012   (DE) .......................... 10 2012 110 698

(51) Int. Cl.
*H05K 7/10*   (2006.01)
*H01R 9/26*   (2006.01)
(Continued)

(52) U.S. Cl.
CPC ............. *H05K 7/10* (2013.01); *H01R 9/2675* (2013.01); *H05K 7/026* (2013.01); *H05K 7/1478* (2013.01)

(58) Field of Classification Search
CPC ........ H05K 7/10; H05K 7/1478; H05K 7/026; H01R 9/2675
See application file for complete search history.

(56) References Cited

U.S. PATENT DOCUMENTS 5,510,960 A    4/1996  Rosen
5,716,241 A *  2/1998  Hennemann ............ G06F 1/184
                                                     439/716
(Continued)

FOREIGN PATENT DOCUMENTS

DE    196 51 962 A1    6/1998
DE    19651961          6/1998
(Continued)

OTHER PUBLICATIONS

X20 System User's Manual Part 1; May 2009; 81 pp.
(Continued)

*Primary Examiner* — Hoa C Nguyen
*Assistant Examiner* — Christopher L Augustin
(74) *Attorney, Agent, or Firm* — Harness, Dickey & Pierce, P.L.C.

(57) ABSTRACT

A device for open-loop control or closed-loop control of a technical installation has a first backplane module, a second backplane module and a third backplane module which are configured to be positioned side by side on a mounting rail in a longitudinal direction. The first backplane module has a first main body and a first contact part. The second backplane module has a second main body and a second contact part. The third backplane module has a third main body and a third contact part. The main bodies each have an upper side comprising insertion openings which are configured to receive electrical contacts of separate electronic modules. The contact parts form a bus line in the longitudinal direction such that plugged-in electronic modules can be electrically coupled to one another by means of the contact parts. The second main body further has a receptacle, in which the second contact part is arranged in one of at least two defined variants. In a first variant, the second contact part has an electrically conductive connection to the first contact part (Continued)

and to the third contact part. In a second variant, the second contact part has an electrically conductive connection to the third contact part, but not to the first contact part.

20 Claims, 9 Drawing Sheets

(51) Int. Cl.
*H05K 7/14* (2006.01)
*H05K 7/02* (2006.01)

(56) References Cited

U.S. PATENT DOCUMENTS

| | | | |
|---|---|---|---|
| 6,172,875 B1* | 1/2001 | Suzuki | G06F 1/183 361/679.4 |
| 6,172,877 B1 | 1/2001 | Feye-Hohmann et al. | |
| 7,944,084 B2 | 5/2011 | Bräunlich et al. | |
| 2004/0033720 A1 | 2/2004 | Bergner et al. | |
| 2005/0037673 A1 | 2/2005 | Fernand et al. | |
| 2007/0066147 A1 | 3/2007 | Braunlich et al. | |
| 2010/0103627 A1* | 4/2010 | Nelson | G05B 19/0421 361/730 |
| 2011/0164350 A1 | 7/2011 | Kanaya et al. | |
| 2013/0027890 A1* | 1/2013 | Berger | H05K 7/1468 361/747 |

FOREIGN PATENT DOCUMENTS

| | | |
|---|---|---|
| DE | 197 10 768 A1 | 9/1998 |
| DE | 10 2004 020 995 A1 | 11/2005 |
| EP | 1511054 | 3/2005 |
| EP | 1764873 | 3/2007 |
| EP | 2 009 522 A1 | 12/2008 |
| JP | 2000-148214 | 5/2000 |
| JP | 2004-509471 | 3/2004 |
| WO | WO 2005/003869 A1 | 1/2005 |

OTHER PUBLICATIONS

X20 System User's Manual Part 2; May 2009; 61 pp.
X20 System User's Manual Part 3; May 2009; 102 pp.
X20 System User's Manual Part 4; May 2009; 194 pp.
X20 System User's Manual Part 5; May 2009; 284 pp.
X20 System User's Manual Part 6; May 2009; 249 pp.
X20 System User's Manual Part 7; May 2009; 118 pp.
X20 System User's Manual Part 8; May 2009; 113 pp.
PSSuniversal Programmable control systems PSS®—System Description—No. 21256-EN-04; 2010; 89 pp.
ISA/EP; English language translation of International Preliminary Report on Patentability (Chapter 1); issued by WIPO May 12, 2015; 18 pp.
International Search Report; dated Feb. 21, 2014; 2 pp.
Japanese Examination Report (English translation included) for Appl'n No. 2015-541069; dated Jun. 22, 2017; 6 pp.

* cited by examiner

MODULAR DEVICE FOR OPEN-LOOP CONTROL OR CLOSED-LOOP CONTROL OF A TECHNICAL INSTALLATION

CROSS REFERENCES TO RELATED APPLICATIONS

This application is a continuation of international patent application PCT/EP2013/071922 filed on Oct. 21, 2013 designating the U.S., which international patent application has been published in German language and claims priority from German patent application DE 10 2012 110 698.3 filed on Nov. 8, 2012. The entire contents of these priority applications are incorporated herein by reference.

BACKGROUND OF THE INVENTION

The present invention relates to a modular control device for open-loop control and/or closed-loop control of a technical installation. More particularly, the invention relates to an improved modular design of a backplane for use in such a control device.

A prior art control device is known from the applicant's system description "PSSuniversal, Programmable Control Systems PSS®, System Description No. 21256-EN-04". PSSuniversal comprises various modules including electronic modules and what is called base modules. The electronic module are designed to be plugged onto the base modules. The base modules are designed to be arranged adjacent to one another in order to form a backplane including a bus line for interconnecting the electronic modules.

There are different types of the electronic modules in this prior art system. In a first type, the electronic module can be an input/output module, i.e. a module that has inputs for connecting sensors and/or has outputs for connecting actuators. In such a case, the electronic module may transmit sensor data via the bus line to a remote programmable logic controller, and/or the electronic module may receive control data from the programmable logic controller via the bus line, said control data being output in the form of control signals to the actuators. In a second type, the electronic module can be a voltage supply module, also termed a power supply module. The voltage supply module is used for establishing what is called Module Supply, i.e. it is used for feeding a supply voltage to other electronic modules, and/or it is used for establishing a Periphery Supply, i.e. for feeding a supply voltage to the sensors and/or actuators. By using a plurality of power supply modules it is possible to build a plurality of separate voltage potential groups, which is advantageous to meet requirements for a high load currents in a flexible manner.

For an input/output module, a specific base module is required that comprises bus connections in two directions (to the right-hand side and to the left-hand side) of the longitudinal direction in order to switch through the data and also the supply voltage from the module that is lying on the left-hand side to the module that is lying on the right-hand side. The corresponding base module is therefore referred to as a base module with a through-connected bus. For a voltage supply module, however, a special base module is required that is not connected to the supply voltage bus in a first direction (e.g. to the left-hand side), but is connected in the opposite direction (e.g. to the right-hand side).

Although this prior art system thus provides some desired flexibility in terms of allowing separate voltage potential groups, a reconfiguration involving a change of the voltage supply requires to change the backplane which can be cumbersome in some situations. Moreover, different types of base modules have to be produced and maintained.

SUMMARY OF THE INVENTION

It is an object of the present invention to provide a device of the type mentioned in the introduction that requires lower production costs, is more user-friendly and can be reconfigured in a more flexible manner.

In accordance with a first aspect of the invention, there is provided a device for open-loop control or closed-loop control of a technical installation, comprising a first backplane module, a second backplane module and a third backplane module configured to be positioned side by side on a mounting rail that defines a longitudinal direction, wherein the first backplane module comprises a first main body and a first contact part, wherein the second backplane module comprises a second main body and a second contact part, wherein the third backplane module comprises a third main body and a third contact part, wherein the first, second and third main bodies each have an upper side comprising insertion openings configured to receive electrical contacts of separate electronic modules, wherein the first, second and third contact parts are configured to form an electrically conductive bus line in the longitudinal direction, wherein the second main body comprises a receptacle for the second contact part and the second contact part is configured to be arranged in said receptacle in either a first positional arrangement or in a second positional arrangement, wherein the second contact part has an electrically conductive connection to the first contact part and to the third contact part in the first positional arrangement, and wherein the second contact part has an electrically conductive connection to the third contact part but not to the first contact part in the second positional arrangement, thereby allowing to selectively connect or disconnect said bus line at said second backplane module.

According to a second aspect, there is provided a device for open-loop control or closed-loop control of a technical installation, comprising a first backplane module, a second backplane module and a third backplane module configured to be positioned side by side on a mounting rail that defines a longitudinal direction, wherein the first backplane module comprises a first main body and a first contact part, wherein the second backplane module comprises a second main body and a second contact part and wherein the third backplane module comprises a third main body and a third con-tact part, wherein the first, second and third main bodies each have an upper side for mounting electronic modules, and wherein the first, second and third contact parts are configured to form a bus line in the longitudinal direction, wherein the second main body comprises a receptacle accommodating the second contact part, and wherein the second contact part is configured to be selectively arranged in said receptacle in one of at least two defined variants, wherein the second contact part has an electrically conductive connection to the first contact part and to the third contact part in a first variant of the at least two variants, and wherein the second contact part has an electrically conductive connection to the third contact part but not to the first contact part in a second variant of the at least two variants.

According to a third aspect, there is provided a backplane module for use in a device for open-loop control or closed-loop control of a technical installation, said backplane module comprising a main body having an upper side, a side face first and a second side face, wherein the upper side comprises insertion openings with backplane contacts designed for mechanical fastening and electrically contacting a separate electronic module, wherein the first side face is designed for mechanically connecting to a similar-type first backplane module, and wherein the second side face is designed for mechanically connecting to a similar-type second backplane module, said backplane module further comprising at least one contact part having an electrical contact configured for electrically connecting the similar-type first or second backplane module, said backplane module further comprising a receptacle in which the contact part can selectively be arranged in one of at least two defined variants, wherein the contact part has an electrically conductive connection to the first similar-type backplane module and to the second similar-type backplane module in a first variant of the at least two variants, and wherein the contact part has an electrically conductive connection to the second similar-type backplane module but not to the first similar-type backplane module in a second variant of the at least two variants.

Thus a modular device comprising at least three backplane modules configured to support electronic modules is provided. Preferably, the device comprises more than three backplane modules in a row, wherein the three backplane modules that are significant in this case can be arranged in any position in the row. Likewise, the three backplane modules can be arranged adjacent to one another in the longitudinal direction or counter to the longitudinal direction. The electronic modules can be plugged onto the backplane modules. The electronic modules can therefore be coupled to one another via a bus whose bus line is provided by means of the backplane modules. In contrast to devices in the prior art, in this case at least part of this bus is formed by means of separate module parts, namely at least the variable second contact part. In preferred refinements, however, the contact parts are also provided in the first and third backplane module as separate module parts that are fastened to the respective main bodies. The contact parts form a row of line sections that are arranged piece-by-piece adjacent to one another and the bus signals are transmitted via said line sections. The contact part of the second backplane module has two variants in this case. In the first variant, the contact part switches the bus through, i.e. an electrically conductive connection is provided from the preceding contact part to the subsequent contact part. In the second variant, the contact part disconnects the bus, i.e. the second contact part is connected to the subsequent contact part, but it is not connected to the preceding contact part.

By virtue of the fact that it is possible to disconnect the bus, the bus can be subdivided into various bus sections that are electrically separated from one another. Individual modules can thus be combined to form groups that are allocated to a common bus section. Should this arrangement change, in that new modules are added, exchanged or removed, the bus can be adjusted to suit the new requirements by varying the second contact part without having to exchange the backplane module. The design of the bus is consequently more flexible and also easier for a user.

Furthermore, the implementation of a bus by using separate contact parts has the advantage that the contact parts can be adjusted to suit the requirements of the bus without having to change the main body of the backplane modules. By way of example, higher currents and associated higher thermal loadings occur in a supply bus than in a data bus and as a result the requirements relating to the bus structures also increase. However, the bus structure in the novel device is essentially determined by the contact parts and is consequently not dependent upon the structure of the main body of the backplane modules. The main body can consequently be of a simpler design and as a result more cost-effective to produce.

Overall, the novel control device consequently renders it possible to reduce production costs and increase user-friendliness whilst increasing flexibility.

In a first refinement, the first and the third main body each comprise a further receptacle, wherein the first contact part and the third contact part are arranged in a respective one of the further receptacles.

In this refinement, the first and the third backplane module also comprise receptacles for separate contact parts on their respective main bodies, i.e. these backplane modules are also assembled in a modular manner. It is preferred that the main body and the contact part are separate components that together form the backplane module. This refinement is advantageous because the bus structure is formed by means of separate components, namely the contact parts. The contact parts thus form a modular bus line within the modular backplane. It is preferred that the first, second and third main bodies each are constructed in an identical manner. The uniform design of the main bodies renders it possible to produce the backplane modules in a cost-effective manner. In a further refinement, the device comprises a further backplane module having a further main body and a further contact part, wherein the third contact part can be varied with respect to the second contact part and the further contact part in the same manner as the second contact part can be varied with respect to the first contact part and the third contact part.

In this refinement, the backplane is expanded by a further backplane module that is arranged adjacent to the third backplane module. The third contact part can selectively be arranged on the third main body in at least two variants, just as the second contact part. Depending upon which variant the third contact part is in, the bus is switched through or interrupted by the third contact part, i.e. an electrical conductive arrangement between the second contact part and the further contact part is created or separated. If the bus is interrupted, the third contact part is connected to the subsequent further contact part but the third contact part is not connected to the second contact part. In a particularly preferred refinement, even more backplane modules are arranged in the row just as the further backplane module. The respective preceding backplane module is configured as a second backplane module with a variable contact part. It is advantageous in the case of this refinement that the backplane and the integrated modular bus can be extended and enlarged as desired. Preferably, the further backplane modules, further main bodies and further contact parts are constructed in a same manner as the second backplane module, the second main body and the second contact part.

It is particularly preferred that the first contact part, third contact part and each further contact part are constructed in a same manner as the second contact part so that it is possible to selectively set, at each contact part, whether the bus is to be switched through from the preceding contact part through to the subsequent contact part or is disconnected. In this manner, a high degree of flexibility is achieved for the bus structure within the backplane. This is particularly advantageous if it is necessary to change the circuitry and the associated arrangement of the electronic modules in order to form new voltage potential groups. By varying the contact parts, it is also possible to configure the bus sections retrospectively as desired without having to replace, remove or exchange the backplane modules on the mounting rail.

Consequently, it is not necessary to change a backplane that has already been fastened in place when the circuitry is changed, and this saves time and reduces costs.

In a further refinement, the second contact part can assume a defined first positional arrangement and at least one alternative second positional arrangement in the receptacle, wherein the first positional arrangement forms the first variant and wherein the alternative second positional arrangement forms the second variant.

The positional arrangement is defined by a combination of position and alignment. In this refinement, the second contact part can assume a first and at least one second positional arrangement in the receptacle on the main body and depending thereon can be located in the first or second variant. Depending up the variant, the contact part can therefore be arranged in one of at least two different positions and/or in one of at least two different alignments on the main body. Consequently, the variant of the second contact part is primarily determined by the positional arrangement and not so much by the form of the second contact part itself. The second contact part can consequently be identical for the first and second variant and as a consequence the production costs and storage costs can be reduced. However, alternatively, the second contact part may comprise a dedicated structural form for each variant.

In a further preferred refinement, the device comprises a locking element by means of which the second contact part can selectively be fixed in the receptacle either in the first positional arrangement or in the second positional arrangement.

In this preferred refinement, the second contact part can be fixed in the receptacle in the respective positional arrangement. It is preferred for this purpose that a movable pin is arranged on the contact part and said pin in the respective positional arrangement can be inserted into a cut-out in the main body and thus locks the contact part in the respective positional arrangement. By fixing the contact part in the receptacle, the contact part is prevented from becoming accidentally detached or from moving undesirably into the other positional arrangement.

In a further preferred refinement, the first positional arrangement is a first spatial position of the second contact part in the receptacle, and the second positional arrangement is a second spatial position into which the second contact part can be shifted by a translational motion.

In this preferred refinement, the receptacle is larger than the second contact part. The contact part can be arranged in a displaceable manner in the receptacle and can be moved back and forth between at least two positions. In the first position, the contact part is in the first variant. It is preferred that the upper side of the contact part lies flush with the upper side of the main body. In order to change the variant, the contact part is shifted into the second position that is preferably lower in the receptacle. It is therefore not necessary to detach the second contact part from the receptacle in order to change the variant and it is preferred that said second contact part is already arranged in said receptacle in a loss-proof manner at the time of delivery. It is particularly simple to switch between the variants and consequently to sub-divide the bus. It is preferred that the switch between the variants is made automatically by plugging on an electronic module which necessarily requires the bus to be separated. By way of example, this can be a power supply module that moves the contact part during the plugging-on process as a result of a particular construction.

In a further refinement, the bus line comprises a number of first cores and a number of separate second cores, wherein the first cores form a data bus for transmitting control data, and wherein the second cores form a current rail for distributing a supply voltage, wherein the second cores extend through the contact parts, whereas the first cores are arranged in the main body remote from the contact parts.

In this refinement, the bus is sub-divided into two function groups, namely into a data bus on the one hand and into a supply bus on the other hand, which two groups are guided in different ways in or on the backplane modules. Different demands are placed on a data bus than on a supply bus. In the worst case, a supply bus influences the data bus or conversely, by way of example as a result of unintentionally inducing a voltage in the data bus. Furthermore, it is preferred that the data bus cannot be separated, whereas the supply bus can be sub-divided into bus sections with the aid of the contact parts for the purpose of creating different voltage potential groups. The subdivision of the buses, in particular the division of the supply bus into a separate modular structure, creates the required flexibility and simultaneously increases the reliable communication on the data bus.

In a further refinement, at least the second contact part is arranged in the receptacle in such a manner that it can be detached in a non-destructive manner.

In this refinement, the second contact part can be detached from the receptacle and replaced. It is preferred that the contact part is inserted for this purpose as a male connector in the receptacle. This is particularly advantageous if a contact part has a defect and needs to be replaced.

In a further refinement, the second main body has a defined width in the longitudinal direction, wherein the second contact part extends essentially over the defined width.

In this refinement, the second contact part is almost precisely as wide as the second main body. It is preferred that the second contact part contacts the first and the third contact part of the adjacent modules. It is preferred that on one side of the contact part electrical contacts in the form of contact blades for producing an electrical connection protrude beyond the casing of the main body. On the opposite-lying side, the second contact part comprises mating contacts and outwardly protruding contact blades of the adjacent contact part can engage into said mating contacts. It is preferred that the mating contacts do not protrude from the casing of the main body but rather are in-laid in the contact part. It is advantageous in this refinement that the second contact part can be connected directly to the first and the third contact part and the significant contacts for this are themselves arranged on the contact part. This renders it possible in a simple manner to assemble a robust modular current rail that is embodied solely from the contact parts. In addition, this refinement renders possible relatively large contacts that have low transition resistances and are very efficient with respect to heat dissipation.

In a further refinement, at least two of the main bodies form an integrated structural unit.

In this refinement, at least two of the main bodies form "one piece". In preferred exemplary embodiments, the "one piece" main bodies are a single injection molded part that provides the functions of at least two main bodies. A quantization with respective four main bodies that form an integrated structural unit has proven to be particularly preferred in practice in order to assemble large backplanes quickly. Advantageously, there are further backplane modules that only have the function and structural width of a single main body. Backplane modules of different structural widths can be combined with one another in an advantageous manner in order to be able to join large backplanes quickly and in a flexible manner.

In a further refinement, at least the second contact part comprises a synthetic material body with embedded metal contacts for electrically connecting the first and the third contact part.

In this refinement, the second contact part is a robust, self-contained component having a synthetic material body and embedded metal contacts. A component of this type is easy to manufacture as an injection molded part and can be produced in large quantities in a cost effective manner. The contacts, which are preferably embodied as a single metal part in each case, are encased at the same time as injection molding the synthetic material body.

In a further refinement, the second contact part comprises a synthetic material body that is arranged completely within the receptacle.

In principle, the receptacles can be insertion sites at a free end of the main body including, by way of example, insertion elements, clamping elements and/or latching elements, and the contact parts are fastened or can be fastened to said insertion sites in such a manner that said contact parts are accessible from multiple sides. In the present refinement, however, the receptacles are cut-outs or openings in the main body and the contact parts are countersunk to a certain extent therein. The second contact part is protected in this refinement and arranged in a robust manner within the receptacle so that the synthetic material body of the contact part does not protrude beyond the casing of the main body. The main body accommodates the second contact part and protects it in this manner from damage when fitting the electronic modules. In addition, unnecessary edges are avoided.

In a further refinement, the device comprises a first and at least one second electronic module that can selectively be plugged onto the main bodies, wherein the first electronic module comprises first electrical contacts and the second electronic module comprises second electrical contacts, wherein the first electrical contacts are designed to make electrical contact with the second contact part in the plugged-on state only in the first variant, whereas the second electrical contacts are designed to make electrical contact with the second contact part in the plugged-on state only in the second variant.

In this refinement, the first electronic module is advantageously a logic module, in particular an input/out module for electrically connecting sensors and/or actuators, and the second electronic module is a power supply module for supplying a supply voltage into the bus that is formed by means of the contact parts. The first electronic module, which takes power from the bus in the sense of a consumer, is designed in this refinement in such a manner that it only makes contact with the bus if the associated second contact part is in the first variant and is consequently connected to the preceding bus section. The second electronic module which supplies a supply voltage into the bus creates a new voltage potential group in the longitudinal direction and therefore must not be connected to the preceding bus section. The associated second contact part is consequently in the second variant and separated from the preceding bus section.

It is preferred that the electronic module is designed in such a manner that it cannot be plugged mechanically on the backplane module or the electrical contacts are not mechanically connected to the mating contacts if the contact parts are in the wrong variant for the corresponding electronic module. This refinement is particularly advantageous when it comes to avoiding mistakes or incorrect parts being fitted which could lead to the device being damaged. Particularly preferred are electronic modules that automatically place the respective second contact part into the correct variant during the plugging-on process due to the shape of the housing or of the electrical contact.

It goes without saying that the features mentioned above and the features yet to be explained below can be used not only in the respective disclosed combination but also in other combinations or as stand-alone without having to depart from the scope of the present invention.

BRIEF DESCRIPTION OF THE DRAWINGS

Exemplary embodiments of the invention are illustrated in the drawing and are further described in the description below. In the drawing.

DESCRIPTION OF PREFERRED EMBODIMENTS

Figure 1:
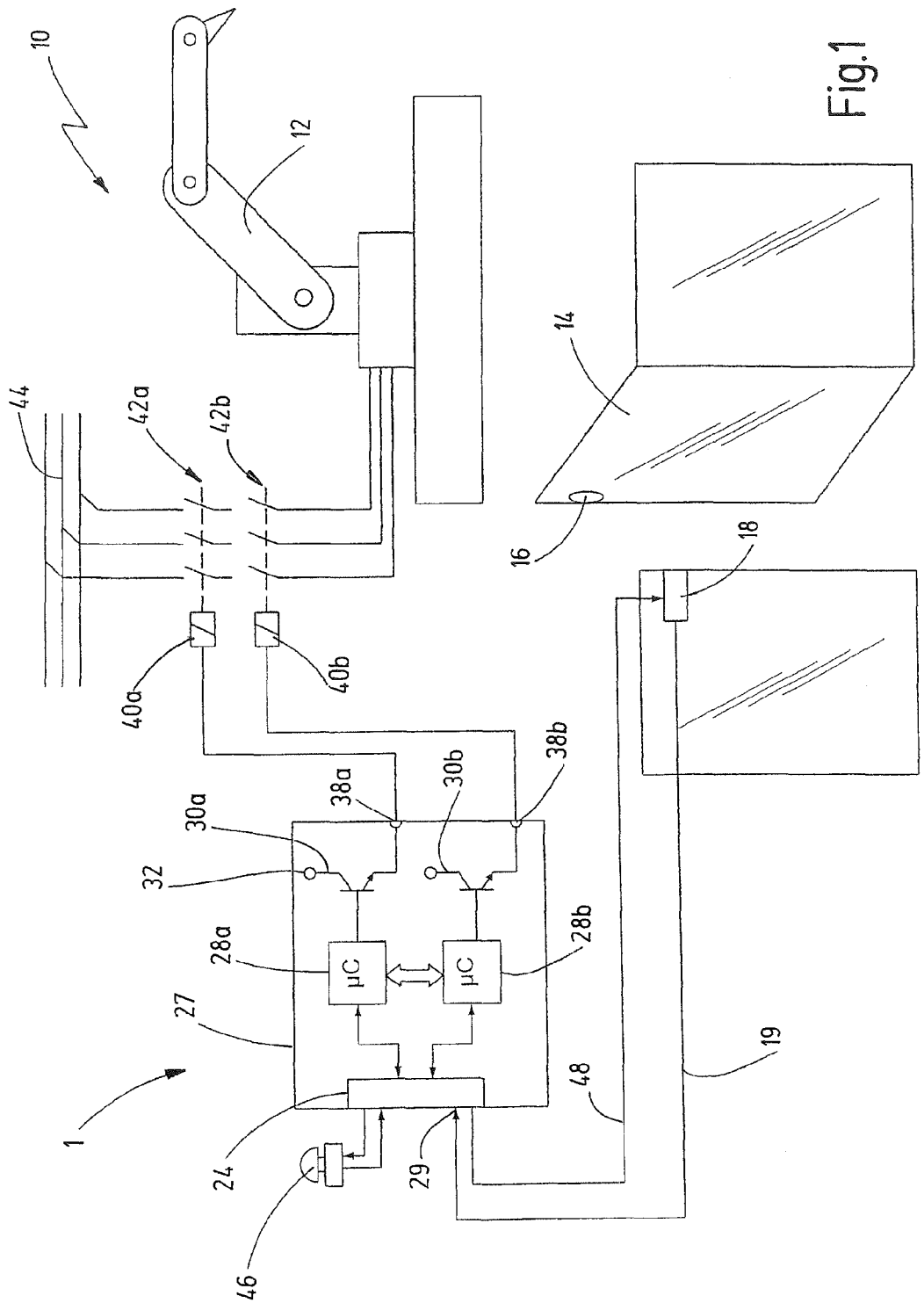
FIG. 1 illustrates a simplified view of a technical installation with an exemplary embodiment of the control device.

FIG. 1 illustrates a technical installation 10 having an exemplary embodiment of the novel device 1 for open-loop and/or closed-loop control (also referred to as control device for automated control) of the technical installation 10. In this exemplary embodiment, the device 1 is suitable for switching off the installation 10 in a failsafe manner, i.e. the device 1 is used for safety-related tasks. The installation 10 comprises by way of example a robot 12 whose movements during the working operation do pose a risk for persons that are present in the work area of the robot 12. For this reason, the work area of the robot 12 is protected by a protective fence having a safety door 14. The safety door 14 provides access to the work area of the robot 12, by way of example for maintenance work or for installation work. However, during the normal working operation, the robot 12 may only work if the safety door 14 is closed. As soon as the safety door 14 is opened, the robot 12 must be switched off or rendered safe in a different manner.

In order to detect that the safety door 14 is in the closed state, a safety door switch having a door part 16 and a frame part 18 is attached to the safety door 14. The frame part 18 generates on a line 20 a safety door signal that is transmitted via line 20 to the novel device 1.

The device 1 comprises in this exemplary embodiment an input/output part 24 having a plurality of connectors (external connectors or device connectors) 29. In some exemplary embodiments, the connectors 29 are connection terminals or field terminals that are arranged on a housing side of housing 27 of device 1, by way of example on a connector module part as will be explained further below. By way of example, the connectors can be spring-loaded terminals or screw-type terminals. In other exemplary embodiments, the connectors can be male connectors or female connectors that comprise multiple contact elements (pins), wherein one respective pin forms one connector. M8-female connectors having five contact pins are frequently used for connecting signaling devices or other sensors on the field level. Accordingly, exemplary embodiments of the novel control device can be or may comprise field devices that are arranged outside a switch cabinet in spatial proximity of the robot 12.

The device 1 comprises two redundant signal processing channels in this exemplary embodiment. By way of example, two microcontrollers 28a, 28b that are connected in each case to the input/output part 24 are shown here. The input signals that the device 1 receives at the device connectors of the input/output part 24 are processed in a redundant manner with respect to one another by the microcontrollers 28a, 28b that compare their results, as is illustrated by an arrow 29. In lieu of two microcontrollers 28a, 28b, it is possible to use microprocessors, ASICs, FPGAs and/or other signal processing circuits. It is preferred that exemplary embodiments of the device 1 comprise at least two signal processing channels that are redundant with respect to one another and that are each able to perform logic signal connections in order to generate a signal in dependence thereon. This signal is used for controlling a switching element in order to switch off the robot 12, if appropriate. A device 1 of this type can be used for switching off the installation 10, such as robot 12 in this case, in a failsafe manner (FS).

In the illustrated case, device 1 comprises two redundant switching elements 30a, 30b. Each of these two switching elements is able to connect a high voltage potential 32 to a device connector 38a, 38b of device 1 in order to enable a current flow to a contactor 40a, 40b or to interrupt this current flow. Consequently, each of the switching elements 30 can switch off an actuator, such as a contactor or a solenoid valve.

The contactors 40a, 40b each comprise working contacts 42a, 42b. The working contacts 42a, 42b are arranged in a row with respect to one another in a power supply path from a power supply 44 to the robot 12. As soon as device 1 switches off the contactors 40a, 40b, contacts 42 no longer make contact and the power supply to the robot 12 is disconnected. It is clear to the relevant persons skilled in the art that this is describing by way of example a "radical" switching-off procedure of this type. As an alternative thereto, it is possible when meeting safety requirements to switch off only parts of the robot 12, such as the dangerous drives, while other parts of the robot 12 remain operational. It is also feasible to delay the switching-off procedure so that the robot 12 can be decelerated in a controlled manner prior to switching off the drives, if appropriate.

Device 1 controls the switching elements 30a, 30b in dependence on the signal of the safety door switch on line 20 and in dependence on a further input signal from an emergency-off button 46. The emergency-off button 46 is also connected via lines to the device connectors of device 1. It is preferred that each such input signal is provided in a redundant manner and two input and output lines or connectors may therefore be provided in each case (not illustrated in FIG. 1). In the example illustrated in FIG. 1, it is therefore possible to provide for the emergency-off button 46 two input lines or inputs that deliver in each case an input signal from the emergency-off button 46. The same applies for the signal of the safety door switch.

In some exemplary embodiments, device 1 generates output signals that are supplied to the individual signaling devices. By way of example, an output signal of this type is supplied via line 48 to frame part 18 of the safety door switch. Frame part 18 passes the output signal of device 1 from line 48 to line 19 if the door part 16 is in the proximity of the frame part 18, i.e. if the safety door 14 is closed. Device 1 can thus monitor the safety door switch with the aid of the output signal on line 48 and with the aid of the input signal on line 19. Device 1 monitors the emergency-off button 46 in a similar manner.

In contrast to the illustration in FIG. 1, two redundant output signals of device 1 are typically used in practice and said redundant output signals are supplied in each case via a separate signal line to a signaling device and via this signaling device back to device 1. By way of example for a configuration of this type, reference is made to DE 10 2004 020 995 A1 that is included herein by reference with respect to details of a redundant monitoring procedure of this type of a signaling device. The emergency-off button 46 is in practice frequently monitored with redundant input and output lines as mentioned above.

In the exemplary embodiment of device 1 illustrated in FIG. 1, the device is used for safety-related tasks, in particular for switching off a system in a failsafe manner (FS). However, device 1 can also be used for tasks that are not safety-related, i.e. for standard tasks (ST).

Device 1 is in particular a modular device for open-loop and closed-loop control procedures and is essentially assembled from a base, also referred to as a backplane, and electronic modules. The backplane is used as a support for the electronic modules and preferably also provides a data bus and/or power supply bus.

Figure 2:
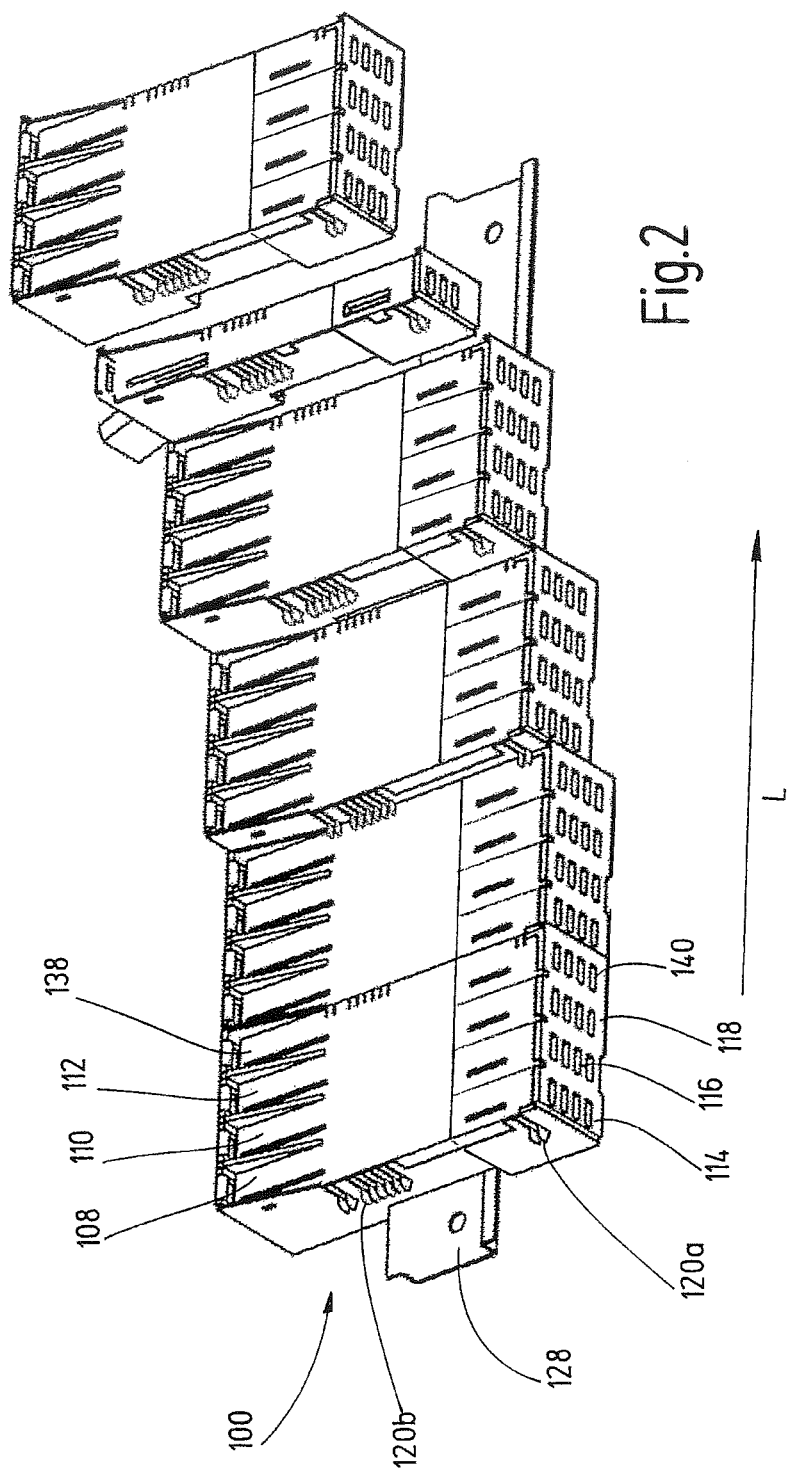
FIG. 2 illustrates a perspective view of an exemplary example of the control device having multiple backplane modules that are arranged adjacent to one another.
Figure 3:
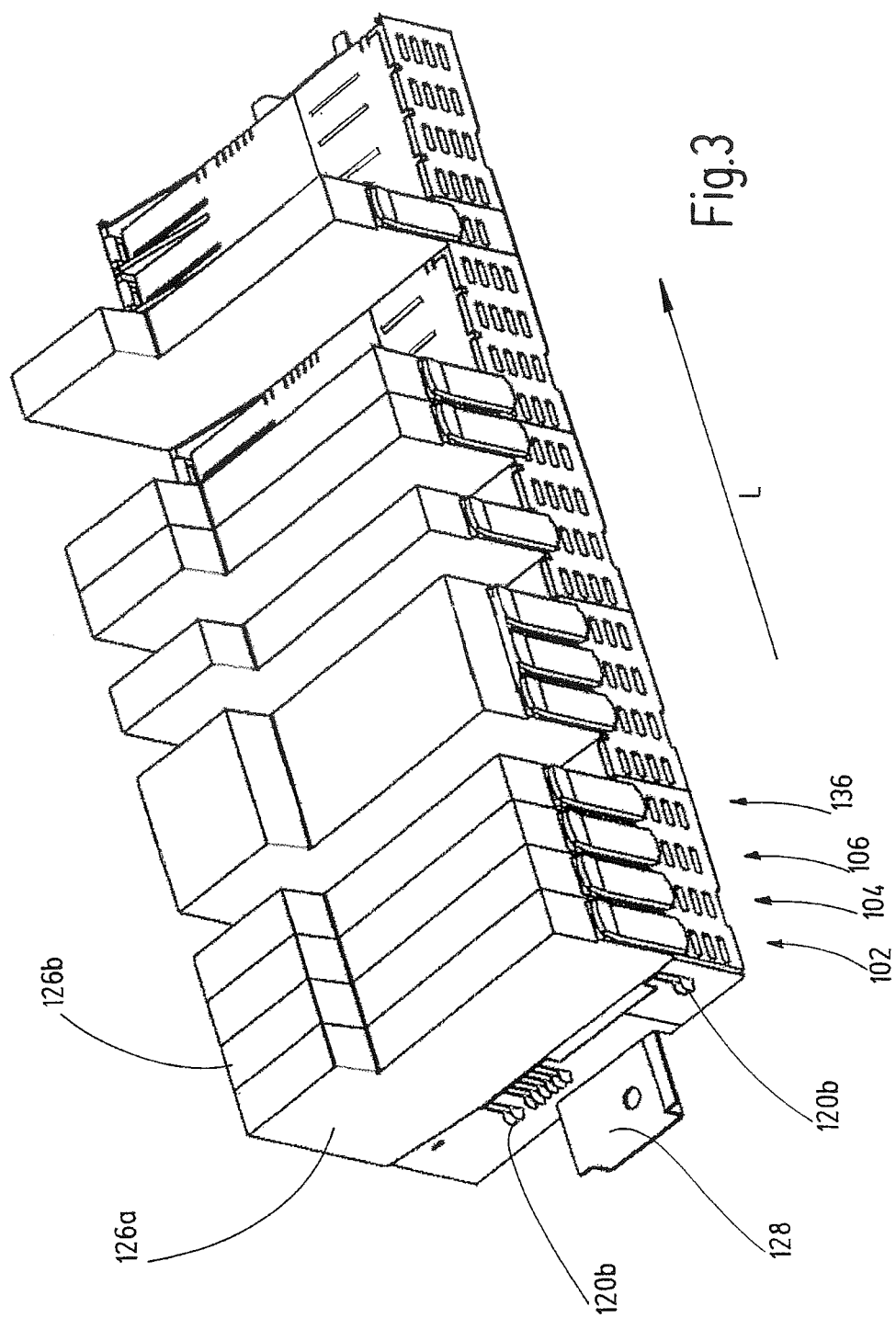
FIG. 3 illustrates a perspective view of the exemplary embodiment of the control device according to FIG. 2 with additional electronic modules on the backplane modules.

FIGS. 2 and 3 illustrate a perspective view of an exemplary embodiment of a backplane 100 having a first, a second and a third backplane module 102, 104, 106 which are mounted in a longitudinal direction L on a mounting rail 128, and having a plurality of further backplane modules 136 having further main bodies 138 and further contact parts 140 that are arranged adjacent to the first, second and third backplane modules 102, 104, 106. Alternatively, the first, second and third backplane module 102, 104, 106 are also arranged at another position within the backplane and/or opposite to the longitudinal direction L on the mounting rail 128. The first, second, third and further backplane modules 102, 104, 106, 136 are of an identical construction in this exemplary embodiment as the first, second, third and further contact parts 114, 116, 118, 140 and the first, second, third and further main bodies 108, 110, 112, 138. For this reason, only the backplane module, the main body and the contact part are mentioned further below. Individual backplane modules are assembled in this exemplary embodiment to form integrated units. Six units are illustrated, of which five units comprise in each case four backplane modules and one unit that comprises only a single backplane module.

The backplane 100 also comprises a communication bus 120b and a separate supply bus 120a. The communication bus 120b extends in the longitudinal direction L separated from the supply bus 120b through the main body of the backplane modules. The supply bus 120a is formed by the contact parts of the backplane modules and extends in parallel to the communication bus 120b.

Furthermore, each backplane module comprises a first and a second insertion opening 122a, 122b by means of which electronic modules (only illustrated in FIG. 3) can be electrically connected to the backplane modules and the bus lines 120a, 120b that extend in said backplane modules. In this exemplary embodiment, an electrical connection is provided to the contact part of a backplane module and the supply bus 120a that extends in said backplane module by means of the first insertion opening 122a. In a manner yet to be explained in more detail, an electronic module can either draw off or supply a supply voltage. The second insertion opening 122b is used to connect an electronic module to the communication bus 120b that extends through the main body.

FIG. 3 illustrates the backplane 100 with electronic modules 126 mounted thereon. An electronic module 126 can be by way of example an input/output module, referred to further below as input/output modules that can be designed as a failsafe module (failsafe or FS) or as a non-failsafe standard module (ST). By way of example for a configuration of this type, reference is made to WO 2005/003869 A1 that is included herein by reference with respect to details of a modular control device of this type.

It is not necessary to arrange the electronic modules 126 adjacent to one another in a continuous row on the backplane. As is evident in FIG. 3, it is not compulsory to arrange an electronic module on a specific backplane module since the communication bus 120b and the supply bus 120a extend in the backplane modules. It is therefore left to the end-user to arrange the electronic modules on the backplane 100 and to assemble them into groups. Likewise, an individual electronic module can also extend over multiple backplane modules as illustrated in FIG. 3.

Device 1 can also comprise a head module (not illustrated in FIG. 2 and FIG. 3) that has interfaces and a processing part, in particular for coordinating the data traffic on the communication bus 120b as described previously. It is possible that the head module is also mounted or can be mounted on mounting rail 128. In FIG. 3, the head module can be arranged by way of example on the left hand side adjacent to the first electronic module in the longitudinal direction L and can be connected to the electronic modules via the bus lines 120.

Figure 4:
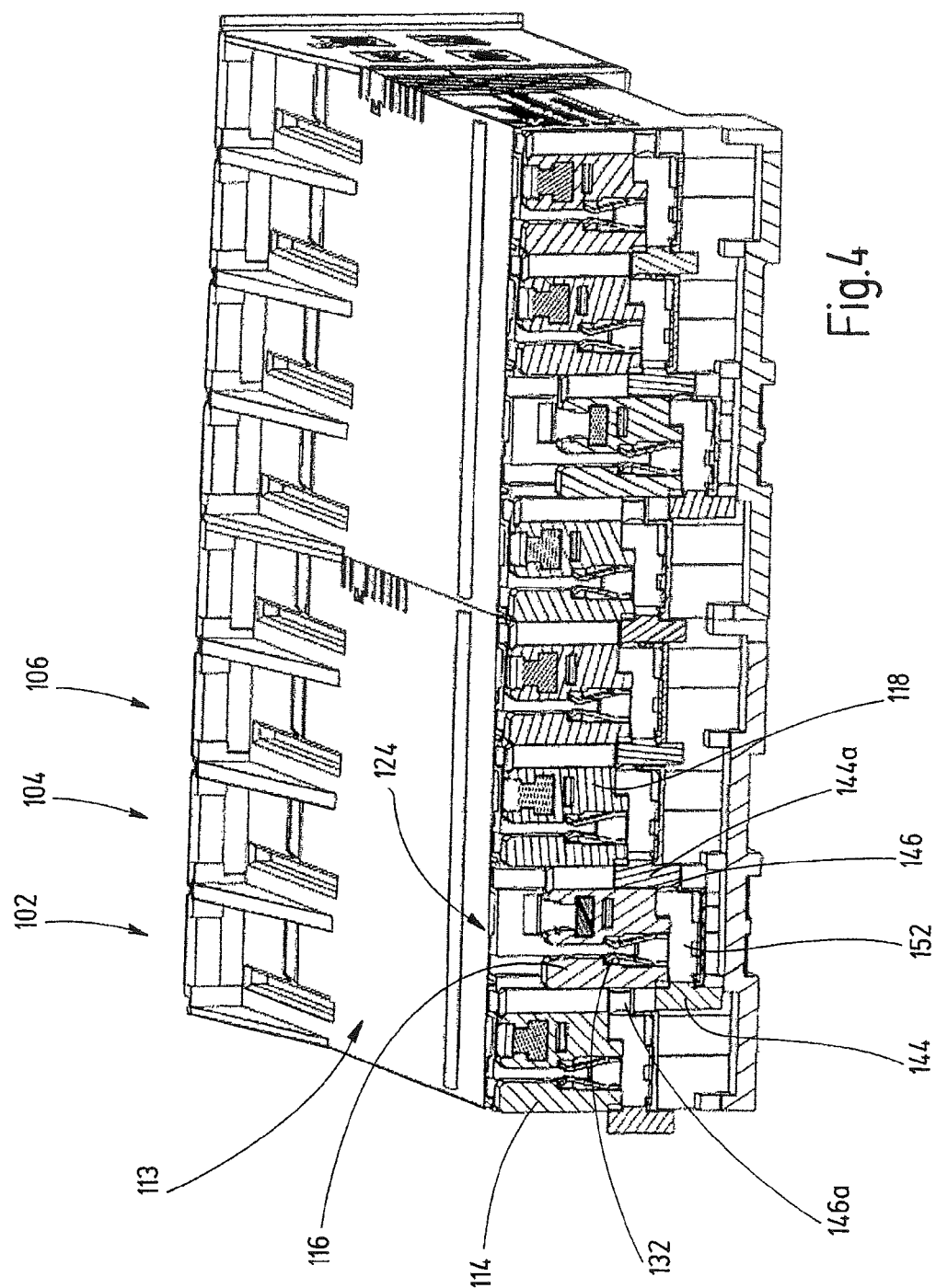
FIG. 4 illustrates a perspective view of an exemplary embodiment of multiple backplane modules with a cross-sectional view through the contact parts.

FIG. 4 illustrates a perspective view of eight backplane modules, wherein the first, second, third and further backplane modules 102, 104, 106, 136 are also constructed in an identical manner. The backplane modules are combined to form two integrated units each comprising four backplane modules. The first backplane module 102 comprises a first contact part 114 in the first variant, the second backplane module 104 comprises a second contact part 116 in a second variant and the third backplane module 106 comprises a third contact part again in the first variant.

The contact parts 114, 116, 118 each are moveably arranged in a recess 124 of the main body and can be moved into one of two positions. In the first position, the upper side of the contact part lies flush with the upper side 113 of the main body, whereas in the second position the contact part is pushed downwards into the main body. It is preferred that the contact parts in both cases are arranged within the dimensions of the main body or within the encasing of the main body and they do not protrude beyond the main body. It is possible by means of an adjustable element 130 to fix a contact part in the respective position. In this exemplary embodiment, a pin is arranged for this purpose on the contact part and said pin can be inserted and fastened in the respective position into a receptacle on the main body and thus protects the contact part from being unintentionally moved. A contact part is in the first variant here if it is located in the first position and in the second variant if it is located in the second position.

In order to explain the manner in which the backplane modules are linked to one another, FIG. 4 further illustrates a cross section through the contact parts of the backplane modules. The contact parts form individual sections of a supply bus 120 that extends along the longitudinal direction L. The second contact part 116 and in this example also all the other contact parts each have a metal conductor 152 that extends through the contact part 116 in the longitudinal direction L and comprises at the ends contacts for connecting to the adjacent contact parts 114, 118. Planar metal contact blades 144 are arranged as contacts protruding out of one side of the contact part, and matching mating contacts 146, in this case in the form of tulip-shaped receptacles are embodied on the opposite side, and the contact blades of adjacent contact parts can engage in said tulip-shaped receptacles. Adjacent-lying contact parts form a chain by means of the metal conductor and the bus extends through said chain.

The second contact part 116 of the second backplane module 104 is in the second variant here, as shown in the figure, i.e. the supply bus is disconnected at this location. The second contact part 116 is lower than the first or third contact part 114, 118 so that the metal conductor 152 is also lower. The mating contact 146a on the first contact part 114 is embodied such that it does not form an electrical connection with the lower-lying contact blade 144, while the lower-lying conductor 152 and the contact blade 144a of the third contact part remain electrically connected on the opposite side. This is achieved by virtue of the fact that the contact blade 144 is longer in the shifting direction of the contact parts and consequently transversely with respect to the longitudinal direction L than the mating contacts 146. Furthermore, the mating contacts 146 are arranged on the conductors 152 in an asymmetrical manner or offset in the upwards direction on one side. As can be seen in FIG. 4 with reference to the first, second and third contact part 114, 116, 118, the blade contact 144 of the second contact part 116 does not reach as far as the higher-lying mating contact 146a of the first contact part 114, whereas the mating contact 146 of the second contact part despite being in the lower-lying displaced position contacts the lower free end of the contact 144a of the third contact part 118. In principle, the dimensions of the contacts 144 and mating contacts 146 could also be reversed. Furthermore, not only can the contact parts be pushed downwards from above in order to interrupt the supply bus; in principle, it is also feasible for the contact parts to be pulled up and/or rotated. However, the exemplary embodiment illustrated in this figure is of advantage because the bus line in this case is closed in the delivery state of the backplane module and can be interrupted by simply pushing the selected contact parts downwards.

The supply bus 120 is disconnected in this case between the first and the second contact part 116 and a new bus section of the supply bus is started with the second contact part 116 and its electrical connection to the third contact part 118. If the second contact part 116 is located in the first variant (top), the metal conductor 152 lies at a height level of the metal conductors in the adjacent contact parts and an electrical connection is provided to both sides.

The metal conductor 152 is also connected to a supply connector 132, in this case in the form of a U-shaped, upwardly open spring-loaded terminal, said supply connector being arranged below the insertion opening 122a. As an electronic module is fitted on the backplane, a contact of the electronic module is guided through the insertion opening 122a to the contact part that depending upon the construction of the electronic module connects or does not connect to the supply connector 132.

In this exemplary embodiment, an electronic module (not illustrated in the figure), which is to draw a voltage from the bus, comprises a rather short contact 134 (cf. FIG. 8) that can only contact the supply connector 132 if the corresponding contact part is located in the first variant. If the corresponding contact part is located in the second variant, the supply connector 132 lies too low and a connection between the contact of the plugged-in electronic module and the supply connector is not provided. The metal conductor and the supply connector connected thereto lie so low that they cannot be reached by the contact of the electronic module. In contrast, a power supply module has a longer contact 134 in this exemplary embodiment in comparison to the electronic module and, as a consequence, can also reach and make contact with the lower-lying supply connector 132. An additional advantage of this construction is that when attempting to place a power supply module on a contact part in the first variant, this is automatically shifted into the second variant because the contact connector of the power supply module pushes the supply connector in and consequently pushes in the entire contact part and moves into the second variant. However, this does presuppose in the present exemplary embodiment that the locking element for fixing the contact part is released or a locking element of this type is not provided at all.

It is further evident from the cross-sectional view that, if the contact parts are constructed in an identical manner, the bus can be disconnected at each backplane module and a new bus section can be started accordingly. For this purpose, all contact parts are constructed in a variable manner similar to that of the second contact part 116. The respective preceding contact part in a row can act like a first contact part and the respective following contact part can act like a third contact part with respect to any contact part in the row. It is possible in this manner to divide the supply bus 120 into individual separate bus sections. The bus sections can form different voltage potential groups by supplying different supply voltages.

Figure 5:
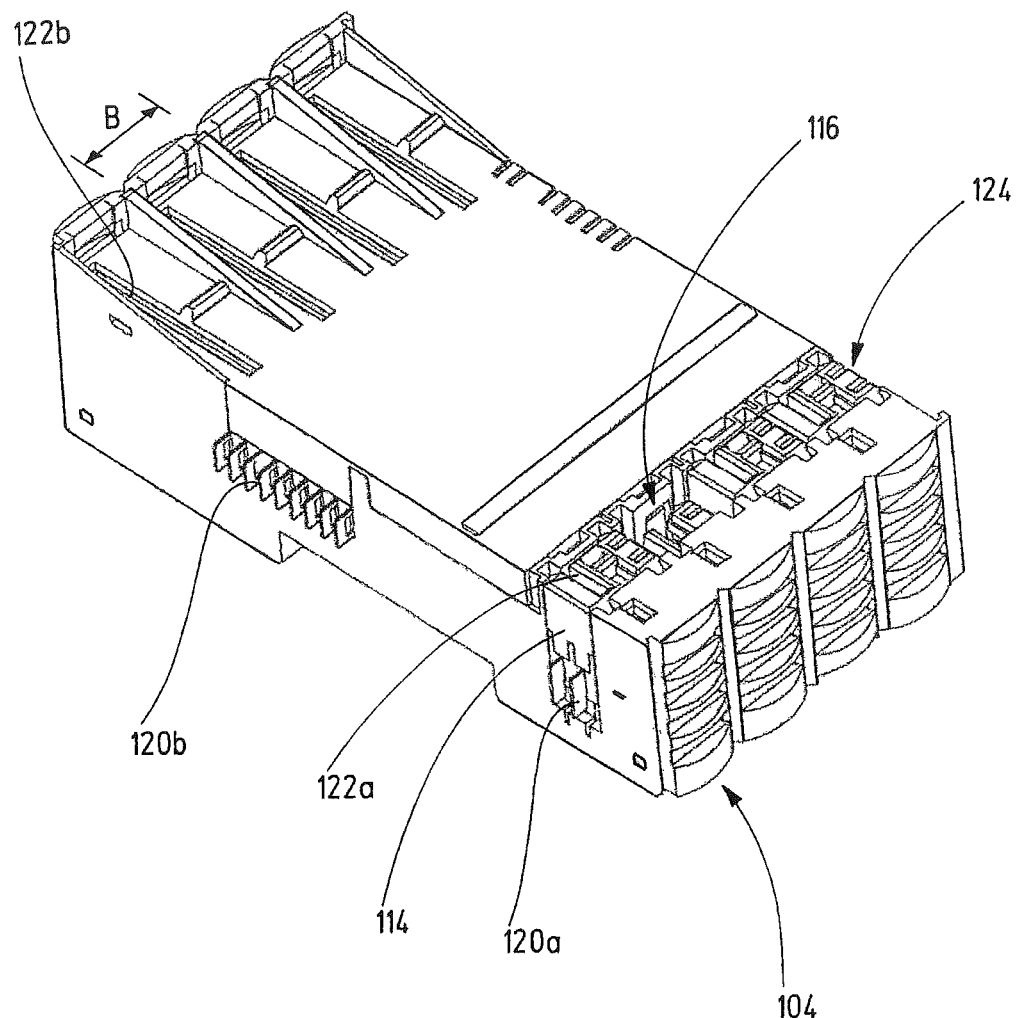
FIG. 5 illustrates a perspective view of an exemplary embodiment with four backplane modules in an integrated unit.
Figure 5A:
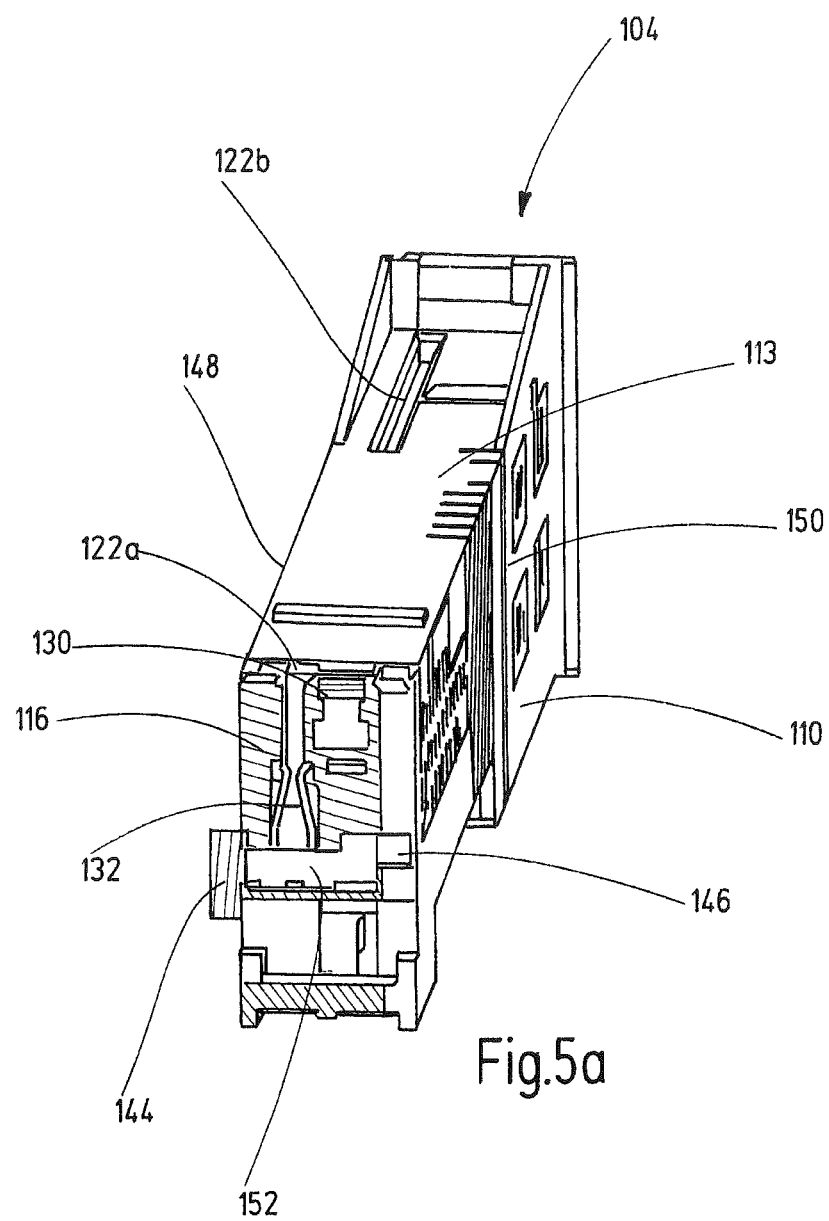
FIG. 5a illustrates a perspective view of an individual backplane module.

FIG. 5 and FIG. 5a illustrate two different preferred models for backplane modules. FIG. 5 illustrates a perspective view of an exemplary embodiment of a model having four backplane modules that are combined to form one "piece". The four main bodies of the backplane modules are manufactured in this case as one piece and form an integral unit, whereas the contact parts 116 of the backplane modules 104 are still individual modular elements that are arranged on the main bodies, preferably in a loss-proof manner. The fact that the contact parts are manufactured as separate modular elements emphasizes the modular construction of the supply bus 120a in comparison with the parallel extending communication bus 120b. Whereas the communication bus 120b is looped through all backplane modules in the same manner and is therefore fixedly integrated in the main body or in the combination of the main bodies, the supply bus 120a can be individually adjusted at each backplane module by means of the contact parts.

FIG. 5a illustrates a further exemplary embodiment of a backplane module 104. This embodiment offers maximum flexibility but it is more costly to construct than larger backplanes. It is therefore preferred that the constructions illustrated in FIG. 5 and FIG. 5a are used in combination and the novel control device advantageously comprises backplane modules of both constructions.

Figure 6:
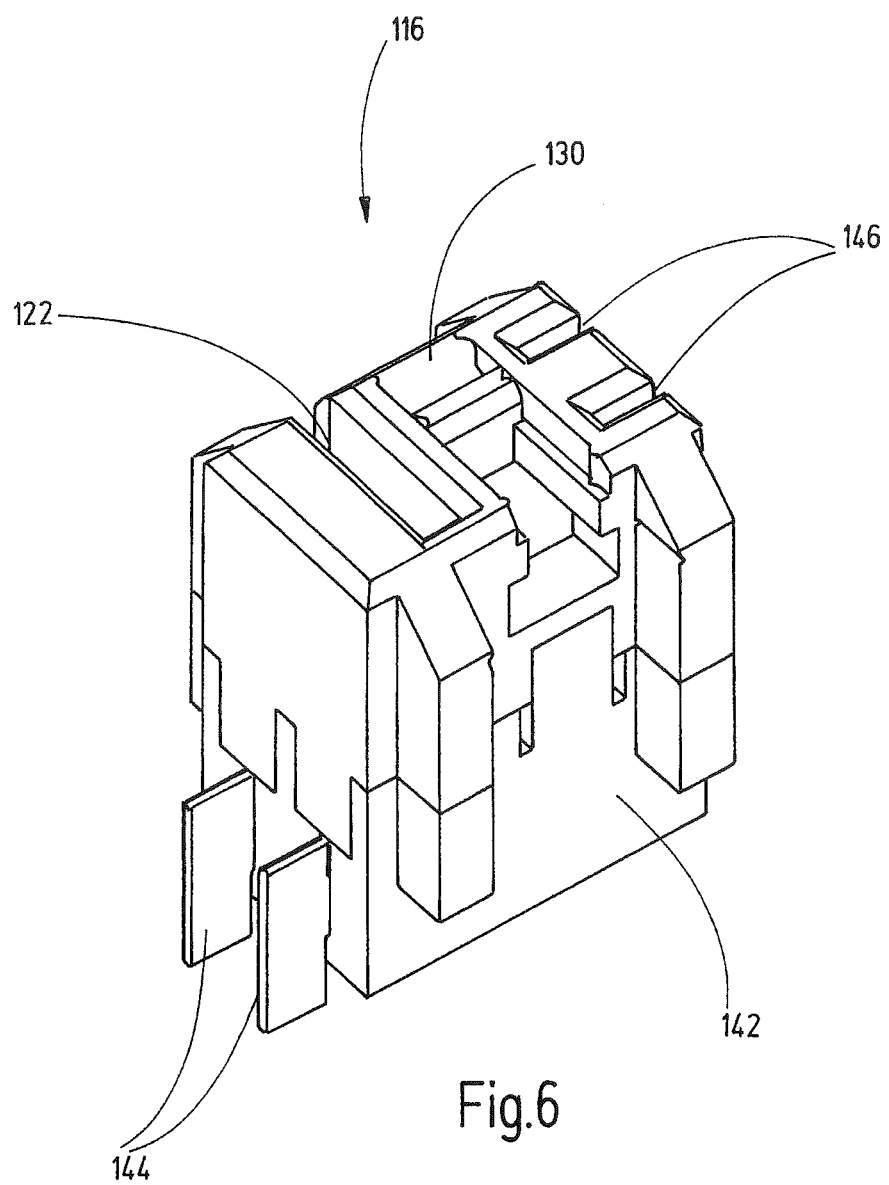
FIG. 6 illustrates a perspective view of a second contact part.

FIG. 6 illustrates a perspective view of an exemplary embodiment of a second contact part 116. The second contact part 116 comprises in this case a self-contained synthetic material body 142 and comprises contact blades 144 that protrude therefrom on one side and corresponding mating contacts on the opposite-lying (remote) side. The mating contacts 146 are in this case tulip-shaped receptacles and the contact blades of an adjacent contact part can engage into said tulip-shaped receptacles in a perpendicular manner from above. The figure also illustrates in each case two contacts on each side for a two-core bus. Alternatively, the supply bus can also comprise further cores or only a single core.

A mating contact 146 is respectively connected to a contact blade 144 within the contact part 116 by means of an electrical conductor. It is preferred that the conductor and the respective contacts are a single metal component that is encased using an injection molding technique in order to produce a robust synthetic material body 142 for the contact part 116. Furthermore, the contact part 116 comprises an insertion opening 122 and the electrical contacts 134 of an electronic module can be inserted into said insertion opening. The U-shaped terminal 132 is concealed behind the insertion opening, said U-shaped terminal is connected to the electrical conductor within the contact part 116 and provides an electrical connection to the inserted contact of an electronic module.

Figure 7:
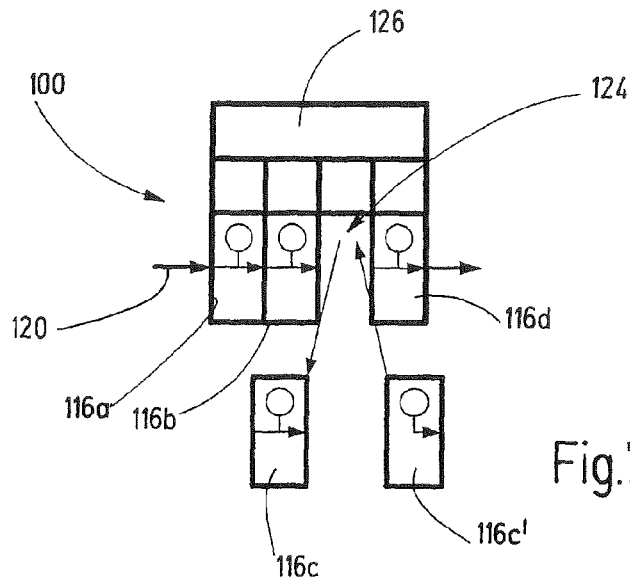
FIG. 7 illustrates a schematic view of an exemplary embodiment with second contact parts in the first and second variant.
Figure 7A:
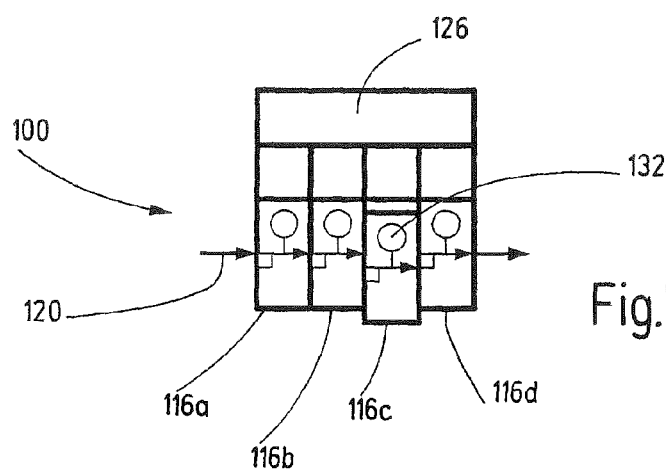
FIG. 7a illustrates a schematic view of a further exemplary embodiment.
Figure 7B:
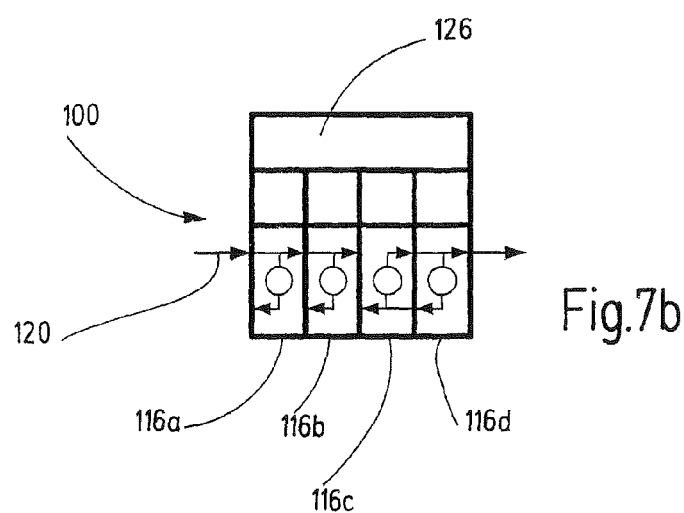
FIG. 7b illustrates a schematic view of a further exemplary embodiment and FIG. 8 illustrates a perspective view of an individual second backplane module with an electronic module.

FIGS. 7, 7a and 7b illustrate schematically further exemplary embodiments of the novel control device. All three figures illustrate a control device having an electronic module 126 that is plugged on a backplane. The electronic module 126 extends in these figures over four backplane modules. The backplane 100 is assembled from four individual backplane modules that comprise in this example identically-shaped main bodies. Four second contact parts 116a, 116b, 116c, 116d are arranged on the main bodies and a supply bus line 120 (illustrated by the arrows) extends through said second contact parts. Viewed in the longitudinal direction L, the second contact parts 116a, 116b, 116d are in the first variant and the second contact part 116c is in the second variant.

In FIG. 7, the second contact part 116c is releasably fastened to the main body so as to be exchangeable. Either a contact part 116c or a contact part 116c' can selectively be fastened in the receptacle 124. The contact part 116c forms the first variant. The contact part 116c' forms the alternative second variant. The two variants are achieved by means of two different embodiments of the second contact part 116c, 116c'.

In FIG. 7a, the second contact part 116c (at the third position) is arranged offset with respect to the other contact parts 116a, 116b, 116d. The contact part 116c assumes a different position to the adjacent contact parts 116a, 116b and 116d. Although an electrical connection is provided to the subsequent (lying on the right-hand side in the figure) contact part 116d, a connection to the preceding (lying on the left-hand side in the figure) contact part 116b is not provided. Furthermore, the supply connector 132 is offset in this exemplary embodiment with respect to the main body and this influences the extent to which contact can be made with an electronic module that has been plugged on a backplane. It is preferred that only power supply modules can mechanically contact the supply connector 132 of the offset contact part 116*c*. If the contact part 116*c* is displaced into a position that corresponds to the contact parts 116*a*, 116*b*, 116*d*, this causes the bus line to loop through all four contact parts illustrated. The two variants can therefore be selected with reference to the position of the contact part 116*c* relative to the other contact parts 116*a*, 116*b*, 116*d*. This corresponds to the variability of the exemplary embodiment shown in FIGS. 2 to 6.

In FIG. 7*b*, the second contact part 116*c* is again illustrated in the second variant. In order to change the variant, the second contact part 116*c* in this exemplary embodiment is not replaced or moved into a different position with respect to the main body; rather the alignment of the contact part is rotated by 180°. The change in alignment means that the contact part 116*c* is in the second variant but in the same position with respect to the main body. In this embodiment, the supply connector 132 is preferably in the same position on the main body in each case.

Figure 8:
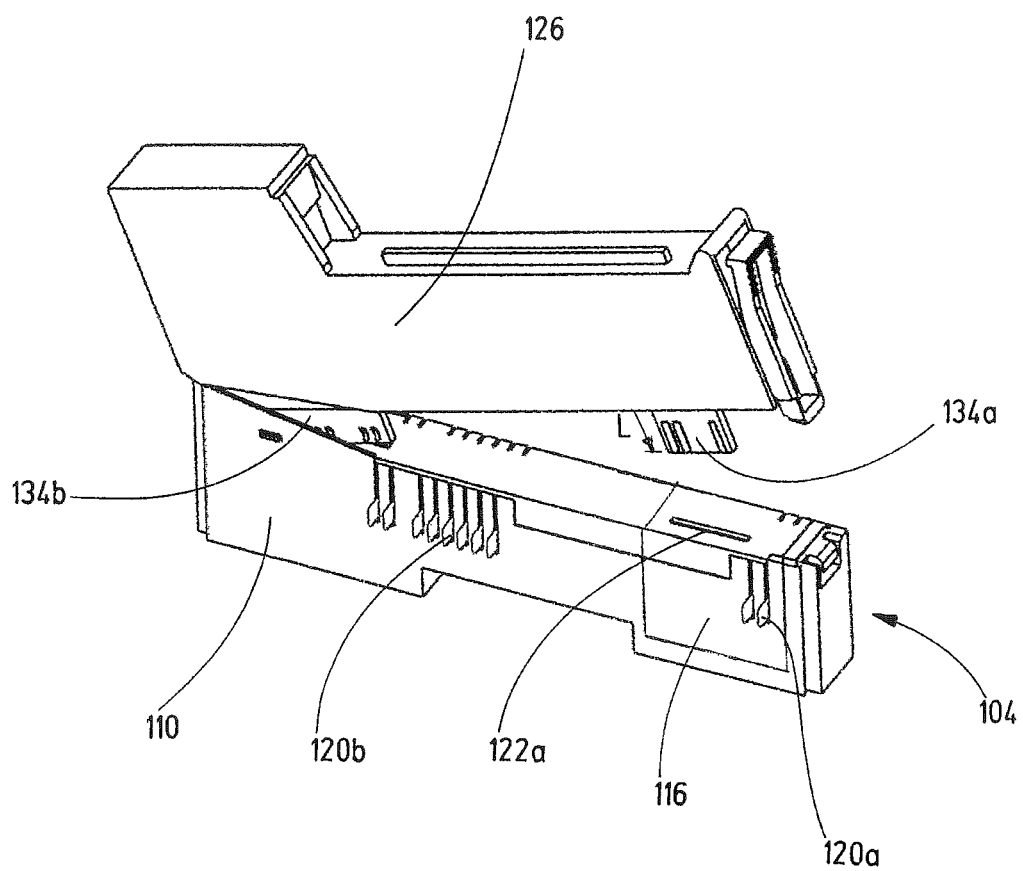

FIG. 8 illustrates a further exemplary embodiment with a single backplane module 104 and a separate electronic module 126 is plugged on said single backplane module. The electronic module 126 is only half plugged on the backplane module 104, in that a first end of the electronic module 126 is hooked into a matching receptacle of the backplane module 110. The electronic module is pushed with a pivoting movement about the first end against the upper side 113 of the backplane module. The backplane module 104 also comprises a communication bus 120*b* that extends through the main body 110, and a supply bus 120*a* that extends through the second contact part 116. The electronic module 126 contacts the backplane module in this exemplary embodiment by means of two contact groups 134*a*, 134*b*. The contact group 134*b* (in this case in the preferred form of a circuit board that protrudes out of the housing of the electronic module and the contact tracks are formed on said circuit board) is inserted with a pivoting movement into the second insertion opening 122*b* and produces an electrical connection to the communication bus 120*b*, whereas the first contact group 134*a* engages in a first insertion opening 122*a* on the contact part 116 and produces an electrical connection to the supply bus 120*a* and in fact depending upon whether the contact part 116 is in the first or second variant.

Whether an electronic module 126 can produce an electrical connection to the second contact part 116 in one of the two variants is determined in this exemplary embodiment by means of the characteristic of the first contact group 134*a*, in particular by means of its length l. Preferably, a power supply module that must make contact with the contact part in the second variant has a first contact group 134*a* that is longer than in the case of an electronic module that is to provide a connection only by means of a contact part in the first variant. This construction also prevents a power supply module being inadvertently plugged on a contact part in the first variant since the first contact 136 has proven itself to be too long for that. In this manner, the mechanics of the configuration prevent an incorrect module being plugged on a contact part.

Alternatively, other constructions can also be used, by way of example a different form of supply connectors 132 of the second contact part in the two variants in order to plug the electronic modules on in an error-proof manner.

Overall, a backplane can comprise a separate bus structure by virtue of the control device in accordance with the invention and said bus structure can be configured in a simple and flexible manner and can be adjusted to suit the respective requirements. The variable contact parts can be produced separately from the main bodies of the backplane and optimized to suit the requirements of the bus.

What is claimed is:

1. A device for open-loop control or closed-loop control of a technical installation, comprising:
 a first backplane module, a second backplane module and a third backplane module positioned side by side, respectively, on a mounting rail that defines a longitudinal direction,
 wherein the first backplane module comprises a first main body and a first contact part,
 wherein the second backplane module comprises a second main body and a second contact part,
 wherein the third backplane module comprises a third main body and a third contact part,
 wherein the first, second and third main bodies each have an upper side comprising insertion openings configured to receive electrical contacts of separate electronic modules,
 wherein the first, second and third contact parts are configured to form an electrically conductive bus line in the longitudinal direction,
 wherein the second main body comprises a receptacle for the second contact part and the second contact part is configured to be selectably movably arranged in said receptacle in either a first positional arrangement or in a second positional arrangement,
 wherein the second contact part has an electrically conductive connection to the first contact part and to the third contact part in the first positional arrangement,
 wherein the second contact part has an electrically conductive connection to the third contact part but not to the first contact part in the second positional arrangement, thereby allowing to selectively connect or disconnect said bus line at said second backplane module, and
 wherein the positional arrangement of said second contact part is selected before said second backplane module is positioned on said mounting rail, such that any electrical connections between the second contact part and said first and third contact parts are established upon connection of the first, second and third backplane modules on said mounting rail.

2. The device of claim 1, wherein the second contact part has a first relative position with respect to the second main body in the first positional arrangement, and the second contact part has a second relative position with respect to the second main body in the second positional arrangement, said first and second relative positions being different from one another.

3. The device of claim 2, wherein the second contact part is configured to be shifted from the first relative position to the second relative position by a translational movement.

4. The device of claim 1, wherein the second contact part has a first orientation with respect to the second main body in the first positional arrangement, and the second contact part has a second orientation with respect to the second main body in the second positional arrangement, said first and second orientations being different from one another.

5. The device of claim 1, further comprising a first and second electronic module that can selectively be plugged onto the first and second main bodies, wherein the first electronic module has first electrical contacts and the second electronic module has second electrical contacts, wherein the first electrical contacts are designed to make electrical contact with the second contact part, when plugged-on, only when the second contact part is in the first positional arrangement, whereas the second electrical contacts are designed to make electrical contact with the second contact part, when plugged-on, only when the second contact part is in the second positional arrangement.

6. A device for open-loop control or closed-loop control of a technical installation, comprising:
a first backplane module, a second backplane module and a third backplane module configured to be positioned side by side on a mounting rail that defines a longitudinal direction,
wherein the first backplane module comprises a first main body and a first contact part,
wherein the second backplane module comprises a second main body and a second contact part,
wherein the third backplane module comprises a third main body and a third contact part,
wherein the first, second and third main bodies each have an upper side comprising insertion openings configured to receive electrical contacts of separate electronic modules,
wherein the first, second and third contact parts are configured to form an electrically conductive bus line in the longitudinal direction,
wherein the second main body comprises a receptacle for the second contact part and the second contact part is configured to be arranged in said receptacle in either a first positional arrangement or in a second positional arrangement,
wherein the second contact part has an electrically conductive connection to the first contact part and to the third contact part in the first positional arrangement,
wherein the second contact part has an electrically conductive connection to the third contact part but not to the first contact part in the second positional arrangement, thereby allowing to selectively connect or disconnect said bus line at said second backplane module,
wherein the second contact part has a first relative position with respect to the second main body in the first positional arrangement, and the second contact part has a second relative position with respect to the second main body in the second positional arrangement, said first and second relative positions being different from one another,
wherein the second contact part is configured to be shifted from the first relative position to the second relative position by a translational movement, and
further comprising an electronic power supply module configured to be mounted on the second backplane module, said electronic power supply module being further configured to automatically shift the second contact part from the first relative position into the second relative position, when the electronic power supply module is attached to the second backplane module.

7. A device for open-loop control or closed-loop control of a technical installation, comprising:
a first backplane module, a second backplane module and a third backplane module positioned side by side, respectively, on a mounting rail that defines a longitudinal direction,
wherein the first backplane module comprises a first main body and a first contact part,
wherein the second backplane module comprises a second main body and a second contact part and
wherein the third backplane module comprises a third main body and a third contact part,
wherein the first, second and third main bodies each have an upper side for mounting electronic modules, and
wherein the first, second and third contact parts are configured to form a bus line in the longitudinal direction,
wherein the second main body comprises a receptacle accommodating the second contact part, and
wherein the second contact part is configured to be selectively arranged in said receptacle in one of at least two defined variants prior to said second backplane module being positioned on said mounting rail,
wherein the second contact part has an electrically conductive connection to the first contact part and to the third contact part in a first variant of the at least two variants, and wherein the second contact part has an electrically conductive connection to the third contact part but not to the first contact part in a second variant of the at least two variants, and
wherein any electrical connections between the second contact part and said first and third contact parts are established upon connection of the first, second and third backplane modules on said mounting rail.

8. The device of claim 7, wherein the first main body and the third main body each comprise a further receptacle for accommodating the first contact part and the third contact part, respectively.

9. The device of claim 8, wherein the first contact part and the third contact part are likewise configured to be selectively arranged in said further receptacles in one of the at least two defined variants.

10. The device of claim 7, wherein the second contact part can assume a defined first positional arrangement and at least one alternative second positional arrangement in said receptacle, wherein the first positional arrangement defines the first variant and the alternative second positional arrangement defines the second variant.

11. The device of claim 10, further comprising a locking element by means of which the second contact part can selectively be fixed in the receptacle in the first positional arrangement or in the second positional arrangement.

12. The device of claim 10, wherein the first positional arrangement is a first spatial position of the second contact part in the receptacle, and the second positional arrangement is a second spatial position into which the second contact part can be shifted.

13. The device of claim 12, wherein the second contact part is configured to be shifted from the first spatial position to the second spatial position by a translational movement.

14. The device of claim 7, wherein the bus line comprises a number of first cores and a number of separate second cores, wherein the first cores form a data bus for transmitting control data, and wherein the second cores form a current rail for distributing a supply voltage, wherein the second cores extend through the first, second and third contact parts, whereas the first cores are arranged remote from the first, second and third contact parts in the main bodies.

15. The device of claim 7, wherein the second contact part is arranged in the receptacle in such a manner that said second contact part can be detached in a non-destructive manner.

16. The device of claim 7, wherein the second main body has a defined width in the longitudinal direction, and wherein the second contact part extends essentially over the defined width.

17. The device of claim 7, wherein the first, second and third main bodies form an integrated structural unit.

18. The device of claim 7, wherein the second contact part comprises a synthetic material body that is permanently arranged in the receptacle.

19. The device of claim 7, further comprising a first and at least one second electronic module that can selectively be plugged onto one of the first, second and third main bodies, wherein the first electronic module has first electrical contacts and the second electronic module has second electrical contacts, wherein the first electrical contacts are designed to make electrical contact with the second contact part in a plugged-on state only in the first variant, whereas the second electrical contacts are designed to make electrical contact with the second contact part in the plugged-on state only in the second variant.

20. A backplane module for use in a device for open-loop control or closed-loop control of a technical installation, said backplane module comprising a main body having an upper side, a first side face and a second side face, wherein the upper side comprises insertion openings with backplane contacts designed for mechanical fastening and electrically contacting a separate electronic module, wherein the first side face is designed for mechanically connecting to a similar-type first backplane module, and wherein the second side face is designed for mechanically connecting to a similar-type second backplane module, said backplane module further comprising at least one contact part having an electrical contact configured for electrically connecting the similar-type first or second backplane module, said backplane module further comprising a receptacle in which the contact part can selectively be arranged in one of at least two defined variants, wherein the contact part has an electrically conductive connection to the first similar-type backplane module and to the second similar-type backplane module in a first variant of the at least two variants, and wherein the contact part has an electrically conductive connection to the second similar-type backplane module but not to the first similar-type backplane module in a second variant of the at least two variants, and wherein said electrically conductive connections are automatically established upon connection of said first and second side faces of said backplane module to said similar-type first and second backplane modules, respectively.

* * * * *